(12) United States Patent
Yamamoto et al.

(10) Patent No.: US 8,709,218 B2
(45) Date of Patent: Apr. 29, 2014

(54) VACUUM PROCESSING APPARATUS, VACUUM PROCESSING METHOD, AND ELECTRONIC DEVICE MANUFACTURING METHOD

(71) Applicant: Canon Anelva Corporation, Kawasaki (JP)

(72) Inventors: Hajime Yamamoto, Tsuru (JP); Hiroyuki Imai, Fuchu (JP)

(73) Assignee: Canon Anelva Corporation, Kawasaki-Shi, Kanagawa-Ken (JP)

( * ) Notice: Subject to any disclaimer, the term of this patent is extended or adjusted under 35 U.S.C. 154(b) by 0 days.

(21) Appl. No.: 13/648,669

(22) Filed: Oct. 10, 2012

(65) Prior Publication Data

US 2013/0032468 A1 Feb. 7, 2013

Related U.S. Application Data (60) Division of application No. 12/952,814, filed on Nov. 23, 2010, which is a continuation of application No. PCT/JP2009/002802, filed on Jun. 19, 2009.

(30) Foreign Application Priority Data

Jun. 20, 2008 (JP) ................. 2008-161477

(51) Int. Cl.
| | |
|---|---|
| C23C 14/00 | (2006.01) |
| C23C 14/32 | (2006.01) |
| C25B 9/00 | (2006.01) |
| C25B 11/00 | (2006.01) |
| C25B 13/00 | (2006.01) |
| C23C 16/00 | (2006.01) |
| C23C 14/50 | (2006.01) |
| C23C 14/56 | (2006.01) |
| C23C 16/458 | (2006.01) |
| H01L 21/683 | (2006.01) |
| H01L 21/687 | (2006.01) |
| H01J 37/34 | (2006.01) |

(52) U.S. Cl.
CPC ............... *C23C 14/50* (2013.01); *C23C 14/568* (2013.01); *C23C 14/56* (2013.01); *C23C 14/564* (2013.01); *C23C 14/566* (2013.01); *C23C 16/458* (2013.01); *H01L 21/6831* (2013.01); *H01L 21/68707* (2013.01); *H01L 21/68728* (2013.01); *H01J 37/3411* (2013.01); *H01J 37/3438* (2013.01)
USPC ... 204/192.1; 118/720; 118/729; 204/192.12; 204/298.15; 204/298.17; 204/298.19

(58) Field of Classification Search
CPC .... C23C 14/50; C23C 14/568; C23C 16/458; C23C 14/56; C23C 14/564; C23C 14/566; H01L 21/6831; H01L 21/68707; H01L 21/68728; H01J 37/3411; H01J 37/3438
USPC ............. 118/729; 204/192.1, 192.12, 298.15, 204/298.17, 298.19
See application file for complete search history.

(56) References Cited

U.S. PATENT DOCUMENTS

| | | | |
|---|---|---|---|
| 5,571,366 A | | 11/1996 | Ishii et al. |
| 5,728,276 A | * | 3/1998 | Katsuki et al. ........... 204/298.11 |
| 5,820,329 A | * | 10/1998 | Derbinski et al. ....... 414/225.01 |
| 2003/0155069 A1 | | 8/2003 | Lee et al. |
| 2003/0162462 A1 | | 8/2003 | Lee et al. |
| 2003/0171057 A1 | | 9/2003 | Lee et al. |

FOREIGN PATENT DOCUMENTS

| | | | |
|---|---|---|---|
| JP | 03-054845 A | | 3/1991 |
| JP | 3-54845 B2 | | 8/1991 |
| JP | 4-282848 A | | 10/1992 |
| JP | 5-343507 A | | 12/1993 |
| JP | 06088221 A | * | 3/1994 |
| JP | 7-122398 A | | 5/1995 |
| JP | 2001-298072 A | | 10/2001 |
| JP | 2003-241202 A | | 8/2003 |
| JP | 2003-255297 A | | 9/2003 |
| JP | 2003-255356 A | | 9/2003 |
| JP | 2004-102215 A | | 4/2004 |
| JP | 2006-156905 A | | 6/2006 |

OTHER PUBLICATIONS

Machine-generated English translation of specification of JP 2001-298072.
International Search Report issued in corresponding application No. PCT/JP2009/002802, dated Jul. 14, 2009.

* cited by examiner

Primary Examiner — Michael Band
(74) Attorney, Agent, or Firm — Buchanan Ingersoll Rooney PC (57) ABSTRACT

A vacuum processing apparatus includes an evacuatable vacuum chamber, a substrate holder which is provided in the vacuum chamber, has a substrate chuck surface vertically facing down, and includes an electrostatic chuck mechanism which electrostatically chucks a substrate, a substrate support member which is provided in the vacuum chamber to keep the substrate parallel to the substrate chuck surface and support the substrate in an orientation that allows the substrate chuck surface to chuck the substrate, and a moving mechanism which moves at least one of the substrate holder and the substrate supported by the substrate support member so as to bring the substrate and the substrate holder into contact with each other, thereby causing the substrate holder to chuck the substrate.

18 Claims, 10 Drawing Sheets

VACUUM PROCESSING APPARATUS, VACUUM PROCESSING METHOD, AND ELECTRONIC DEVICE MANUFACTURING METHOD

This application is a divisional of U.S. application Ser. No. 12/952,814 which is a continuation of PCT/JP2009/002802, filed on Jun. 19, 2009, which claims the priority of JP 2008-161477, filed in Japan on Jun. 20, 2008. The entire contents of PCT/JP2009/002802 and JP 2008-161477 are incorporated herein by reference.

TECHNICAL FIELD

The present invention relates to a vacuum processing apparatus which improves the quality of a deposited film in the vacuum processing apparatus that chucks a process target using electrostatic chuck, and a vacuum processing method and electronic device manufacturing method using the vacuum processing apparatus.

BACKGROUND ART

A substrate processing apparatus which process a substrate set in a substrate holder while keeping the process surface vertically facing down is called a face-down type vacuum processing apparatus. Since fewer foreign substances (particles) drop on the substrate surface, the face-down type vacuum processing apparatus is more advantageous than a face-up type vacuum processing apparatus which processes a substrate with its process surface vertically facing up. However, when setting the substrate in the substrate holder, the face-down type vacuum processing apparatus needs to fix the substrate to the substrate set surface of the substrate holder not to allow the substrate to drop due to gravity.

To fix the substrate, a method of clamping the substrate by holding its periphery is used. In another method, an electrode is provided in the substrate holder, and a DC voltage is applied to the electrode so that the substrate set surface electrostatically chucks (ESC) the substrate (for example, PLT1 to PLT3).

Of the above-described substrate fixing methods, the electrostatic chuck method ensures high substrate temperature controllability as compared to the clamp method. Since there are no shadows of components that hold the substrate periphery for clamping, the process can be performed more uniformly up to the substrate periphery in the vacuum process.

When the face-down type vacuum processing apparatus processes a substrate, the substrate is conventionally transported to the electrostatic chuck holder in accordance with the following steps (1) to (3).

(1) A step of placing an unprocessed substrate on the end of the transport arm of a transport robot provided in a transport chamber, transporting the substrate from the transport chamber into a substrate process chamber, and horizontally moving the substrate to a position vertically under the electrostatic chuck holder.

(2) A step, after step (1), of moving the transport arm or the electrostatic chuck holder vertically downward until the electrostatic chuck holder comes into contact with the substrate.

(3) A step of causing the electrostatic chuck holder to chuck the substrate by supplying a power for electrostatic chuck.

However, when the transport arm is extended, it cannot remain level and bends under its own weight due to the moment of inertia that acts in the gravity direction. Hence, the substrate placed on the transport arm and the electrostatic chuck holder cannot maintain the level positional relationship. When making the electrostatic chuck holder chuck the substrate, if the power is supplied to the electrostatic chuck holder that is not horizontally in contact with the substrate (point contact), the electrostatic chuck force does not act on the entire substrate surface, resulting in a chuck error. To prevent the chuck error, the substrate placing portion at the end of the transport arm uses a spring structure.

Citation List
Patent Literature
PLT1: Japanese Patent Laid-Open No. 3-54845
PLT2: Japanese Patent Laid-Open No. 5-343507
PLT3: Japanese Patent Laid-Open No. 2001-298072

SUMMARY OF INVENTION

Technical Problem

However, the complex spring structure used in the substrate placing portion at the end of the transport arm serves as a particle generation source. In addition, if the vacuum processing apparatus is a sputtering deposition apparatus, foreign substances generated from the spring structure adhere to the target surface of the cathode located on the lower side and cause abnormal discharge. The abnormal discharge influences the quality of a film deposited by the vacuum process.

Solution to Problem

The present invention has been made in consideration of the above-described problems, and has as its object to provide a vacuum processing apparatus and method capable of suppressing particle generation in a face-down type vacuum processing apparatus and reliably holding and processing a substrate.

In the present invention, a substrate support member which supports a substrate parallel to a substrate chuck surface is provided in a vacuum chamber independently of a transport robot, thereby reliably maintaining a parallel orientation.

A vacuum processing apparatus according to an aspect of the present invention is comprising an evacuatable vacuum chamber, a substrate holder which is provided in the vacuum chamber, has a substrate chuck surface vertically facing down, and includes an electrostatic chuck mechanism which electrostatically chucks a substrate, a substrate support member which is provided in the vacuum chamber to support the substrate in an orientation that allows the substrate chuck surface to chuck the substrate, moving means for moving at least one of the substrate holder and the substrate supported by the substrate support member so as to bring the substrate and the substrate holder into contact with each other, thereby causing the substrate holder to chuck the substrate, a shield which is provided in the vacuum chamber to separate a process space of the substrate and a space on a side of an inner wall of the vacuum chamber from each other, and has, an opening to communicate the process space with the space on the inner wall side, and substrate support member driving means, provided outside the vacuum chamber, for, after the moving means causes the substrate to be chucked, making the substrate support member retreat from a position where the substrate has been chucked to the space on the side of the inner wall through the opening of the shield.

Advantageous Effects of the Invention

According to the present invention, it is possible to suppress generation of foreign substances (particles) that drop onto a target and reliably hold a substrate during a process.

BRIEF DESCRIPTION OF DRAWINGS

The accompanying drawings, which are incorporated in and constitute a part of the specification, illustrate embodiments of the invention and, together with the description, serve to explain the principles of the invention.

FIG. 3A is a schematic plan view illustrating a shape of a substrate support member 10a;

FIG. 3B is a schematic plan view illustrating another shape of the substrate support member 10a;

FIG. 3C is a schematic plan view illustrating still another shape of the substrate support member 10a;

DESCRIPTION OF EMBODIMENTS

Preferred embodiments of the present invention will now be described in detail. Note that the constituent elements described in the embodiments are merely examples. The technical scope of the present invention is determined by the scope of claims and is not limited by the following individual embodiments.

A vacuum processing apparatus 1 according to the embodiment of the present invention is comprising a vacuum chamber 2, a substrate holder 3, a substrate support member 10a, and a moving mechanism which causes the substrate holder 3 to chuck a substrate 15.

In the vacuum processing apparatus 1 according to the embodiment of the present invention, the vacuum chamber 2 is an evacuatable chamber.

In the vacuum processing apparatus 1 according to the embodiment of the present invention, the substrate holder 3 is provided in the vacuum chamber 2, has a substrate chuck surface 5a vertically facing down, and includes an electrostatic chuck mechanism which electrostatically chucks the substrate 15.

In the vacuum processing apparatus 1 according to the embodiment of the present invention, the substrate support members 10a are provided in the vacuum chamber 2, and support the substrate 15 in such an orientation that allows the substrate chuck surface 5a to chuck the substrate while keeping the substrate 15 and the substrate chuck surface 5a of the substrate holder 3 parallel.

In the vacuum processing apparatus 1 according to the embodiment of the present invention, the moving mechanism functions as a means for moving at least one of the substrate holder 3 and the substrate 15 supported by the substrate support members 10a so as to bring them into contact with each other, thereby causing the substrate holder 3 to chuck the substrate 15.

Embodiments of the vacuum processing apparatus 1 according to the present invention and a vacuum processing method using the same will be described below in detail with reference to the accompanying drawings.

First Embodiment

Figure 1:
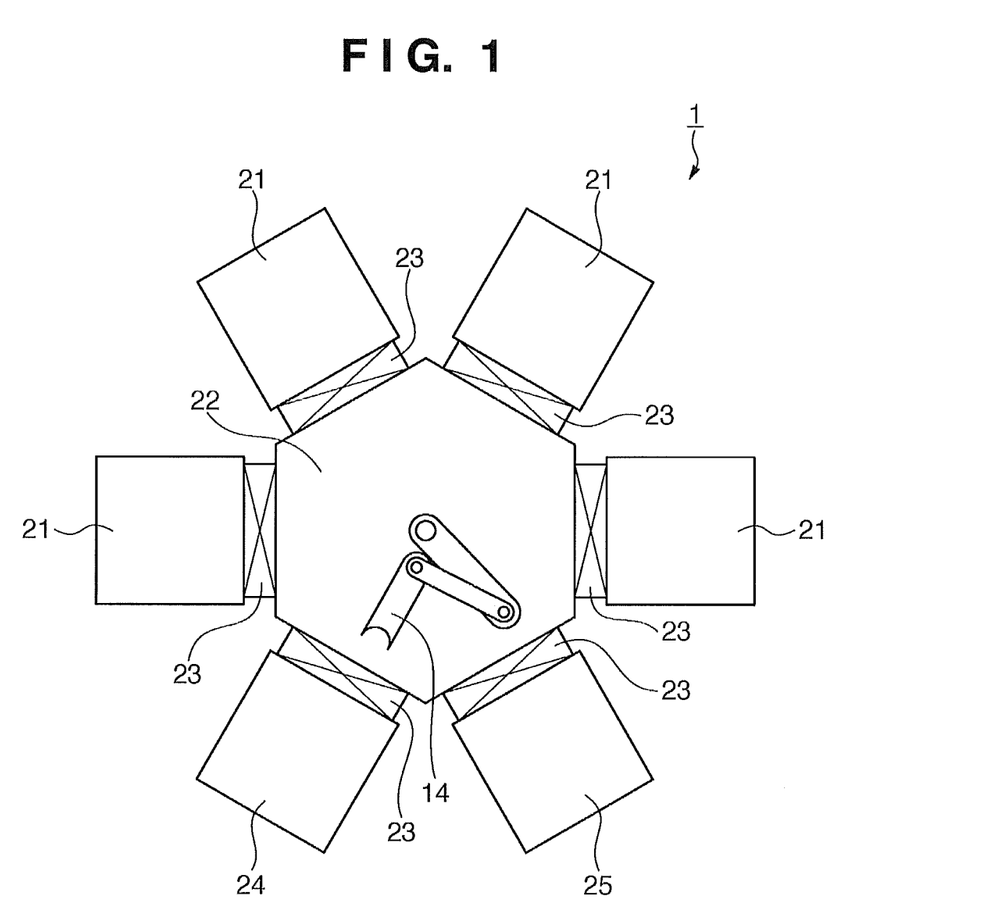
FIG. 1 is a view illustrating the arrangement of a vacuum processing apparatus according to the first embodiment.

FIG. 1 is a schematic view showing the arrangement of a vacuum processing apparatus 1 according to the first embodiment of the present invention. As shown in FIG. 1, the vacuum processing apparatus 1 of this embodiment is formed by connecting a plurality of evacuatable chambers (vacuum chambers) connected to an evacuation system (not shown) to an evacuatable transport chamber 22 via gate valves 23. Examples of the chambers connected to the transport chamber 22 are a load lock chamber 24 which introduces a substrate 15 into the vacuum processing apparatus 1, a substrate process chamber 21 which vacuum-processes the substrate 15, and an unload lock chamber 25 which recovers the processed substrate 15. The vacuum processing apparatus 1 shown in FIG. 1 includes four substrate process chambers 21, one load lock chamber 24, and one unload lock chamber 25. However, the embodiment of the present invention is not limited to this.

The transport chamber 22 includes a transport robot 14 serving as a substrate transport mechanism so as to be able to transport the substrate 15 to each chamber.

Figure 2:
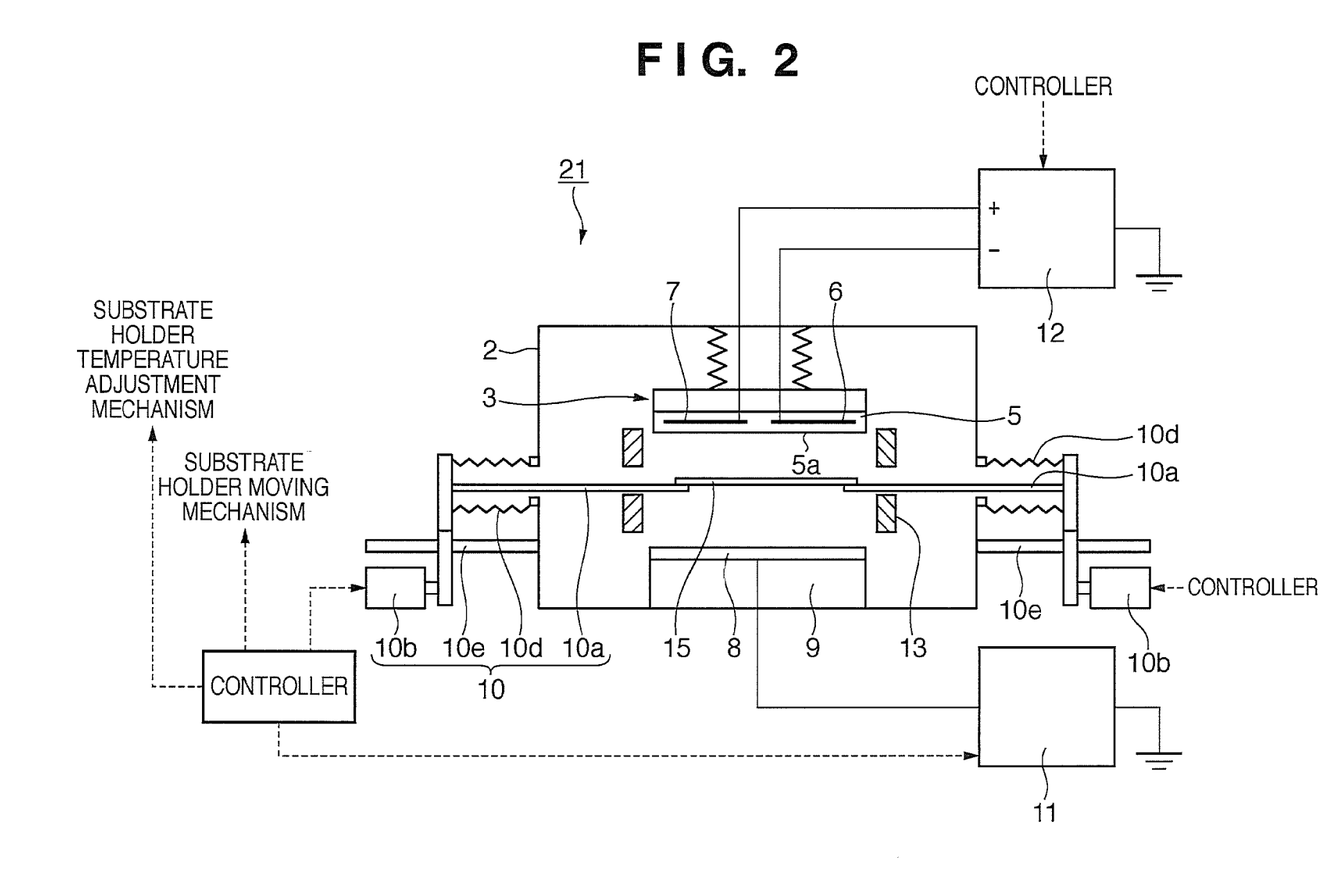
FIG. 2 is a view showing an example of an arrangement mainly including a substrate process chamber 21 provided in the vacuum processing apparatus according to the first embodiment.

FIG. 2 is a schematic view showing an arrangement mainly including the substrate process chamber 21 provided in the vacuum processing apparatus 1 in FIG. 1.

In the arrangement shown in FIG. 2, a substrate holder 3 has an electrostatic chuck holder 5. In this embodiment, the lower surface (substrate chuck surface 5a) of the electrostatic chuck holder 5 in the vertical direction is parallel to the surface of the substrate 15.

The electrostatic chuck holder 5 is made of a dielectric material, and incorporates a plurality of (in this embodiment, two) electrostatic chuck electrodes 6 and 7. The electrostatic chuck electrodes 6 and 7 are connected to an electrostatic chuck DC power supply (ESC DC power supply) 12. The apparatus includes a controller which controls the ESC DC power supply 12 to apply voltages to the electrostatic chuck electrodes 6 and 7 so as to generate a voltage difference.

The substrate holder 3 is connected to a vertically drivable moving mechanism (not shown) so as to be movable in the vertical direction.

A target 8 is located on the lower side inside the vacuum chamber 2, and arranged to parallelly face the electrostatic chuck holder 5 of the substrate holder 3 above.

A DC power supply 11 is connected to the target 8. The DC power supply 11 applies a predetermined voltage to the target 8. That is, the target 8 constitutes a cathode portion. Note that the power supply connected to the target 8 is not limited to the DC power supply. For example, it may be an RF power supply with a frequency of, for example, 13.56 MHz.

A magnet unit 9 is arranged on the rear side of the target 8. The magnet unit 9 forms a specific magnetic field distribution on the surface of the target 8.

Note that the magnet unit 9 uses an electromagnet, permanent magnet, or the like. A plurality of kinds of magnets may be combined.

When performing sputtering deposition using the target 8, the DC power supply 12 and the magnet unit 9 hold the necessary target 8 at a predetermined voltage to form a predetermined magnetic field distribution on the surface of the target 8. This allows sputtering by discharge at a low pressure.

A shield 13 is provided in the substrate process chamber 21. The shield 13 is provided to prevent a film from sticking to the inner wall of the substrate process chamber 21 during deposition by sputtering on the substrate 15 held by the substrate holder 3. In this embodiment, the shield 13 has a shape (for example, almost cylindrical shape) that surrounds the discharge space between the substrate holder 3 and the target 8. The shield 13 has an opening portion (not shown) to transport the substrate 15 into the discharge space.

Substrate support mechanisms 10 exist between the substrate holder 3 and the target 8. The substrate support mechanisms 10 include the substrate support members 10a on which the substrate 15 can be placed, and have a structure for supporting the substrate 15 in such an orientation that allows the substrate chuck surface 5a to chuck the substrate 15. More specifically, the substrate support mechanisms have a structure capable of horizontally supporting the substrate 15 with respect to the substrate chuck surface 5a, as shown in FIG. 2. In this embodiment, the substrate support mechanisms levelly hold the substrate 15 placed on them. Each substrate support mechanism 10 also includes a driving unit 10b such as an air cylinder (not shown) provided outside the substrate process chamber 21. The driving unit 10b can move the substrate support member 10a out of the shield 13. Note that in FIG. 2, a guide member 10e is fixed to the substrate process chamber 21 to guide the substrate support member 10a such that it can horizontally move. Bellows 10d maintain the vacuum state of the substrate process chamber 21.

Figure 3A:
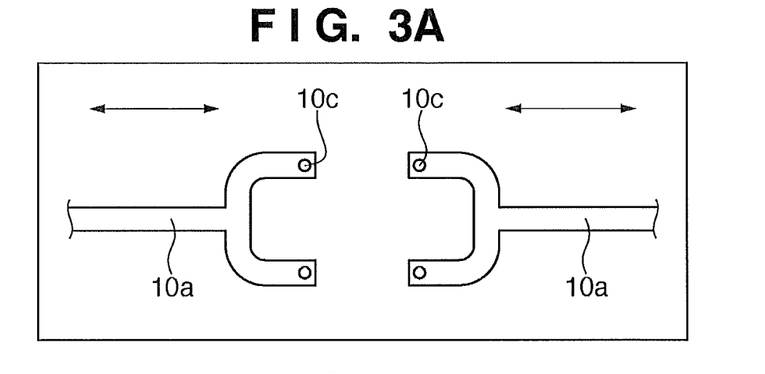
Figure 3B:
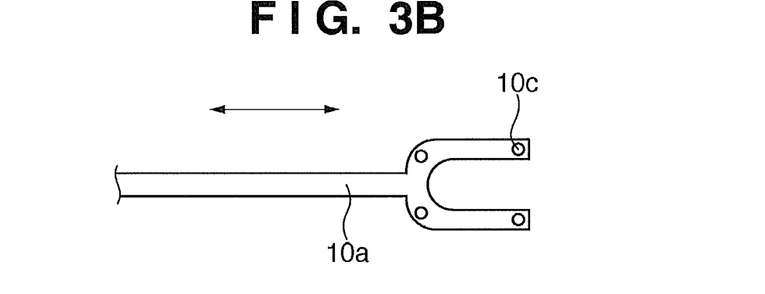
Figure 3C:
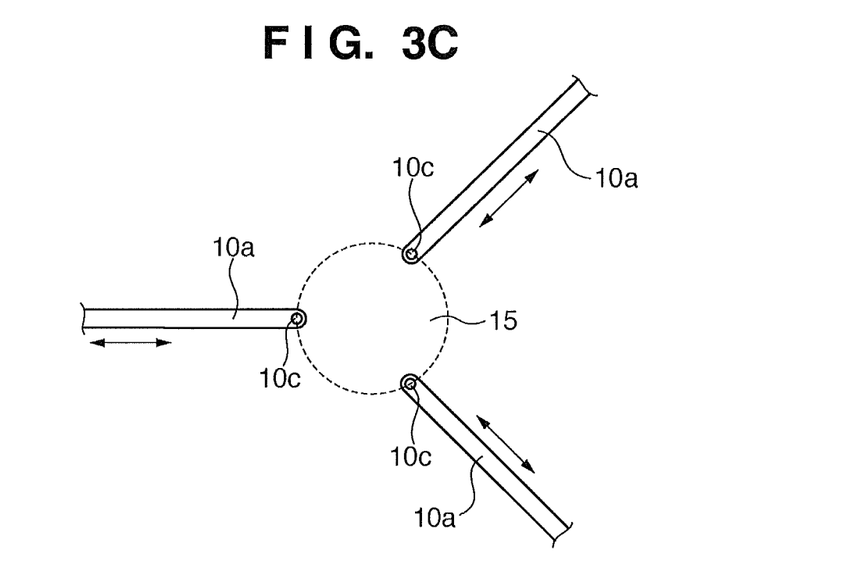

FIGS. 3A to 3C are plan views showing the shapes of the substrate support members 10a.

In this embodiment, as shown in FIG. 2, a pair of substrate support mechanisms 10 are provided on both sides of the discharge space. Hence, as shown in FIG. 3A, the substrate support member 10a of each substrate support mechanism 10 has a shape capable of coming into contact with the substrate 15 at at least two separate points. Each substrate support member 10a includes convex contact portions 10c to equalize the support heights at the contact positions. Each substrate support member 10a is made of a material such as SUS or an aluminum alloy, and designed to be so rigid as to prevent each end from bending under its own weight. The contact portions 10c can be made of SUS. However, they may be made of a ceramic such as quartz or alumina. Using quartz or alumina allows to suppress the influence of contamination on the substrate 15.

Note that as shown in FIG. 3B, the substrate support member may be provided on only one side. That is, one substrate support member may suffice. The contact portions 10c are preferably provided to allow one substrate support member 10a to support the substrate at at least three separate points.

Alternatively, three or more substrate support members 10a may be arranged. For example, three substrate support members 10a may be arranged, as shown in FIG. 3C. In this case, each substrate support member 10a has at least one contact portion 10c. If the substrate support member 10a is long, it bends not a little under its own weight even if the design ensures the rigidity. Considering this, arranging a plurality of substrate support members symmetrically about the substrate center, as shown in FIG. 3A or 3C allows to equalize the bending amounts of the substrate support members 10a and horizontally support the substrate 15.

A process of transporting the substrate 15 will be described next.

FIGS. 4A to 4G are views for explaining a method of loading the substrate 15. Note that the substrate support mechanisms 10 and the moving mechanism (not shown) of the substrate holder 3 shown in FIG. 4A, and the ESC DC power supply 12 and the power supply 11 shown in FIG. 2 are controlled based on signals from the controller. Loading of the substrate 15 is controlled by executing a program in the controller. Note that the controller is formed from, for example, a general computer.

The method of loading the substrate 15 will be described with a focus placed on control of the controller.

Figure 4A:
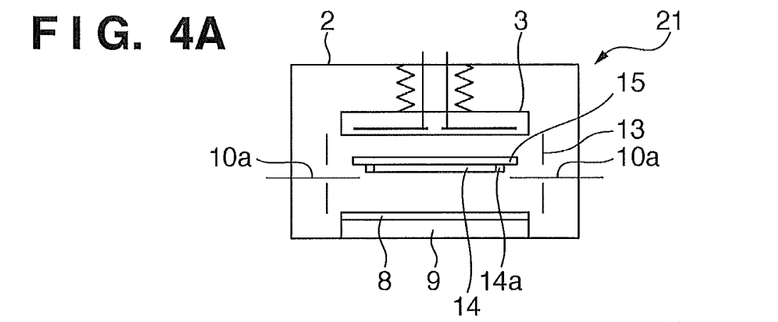
FIG. 4A is a view for explaining a method of loading a substrate 15.

As shown in FIG. 4A, the substrate 15 is placed on an end effector 14a of the transport robot 14 and moved to a position vertically under the substrate holder 3.

Figure 4B:
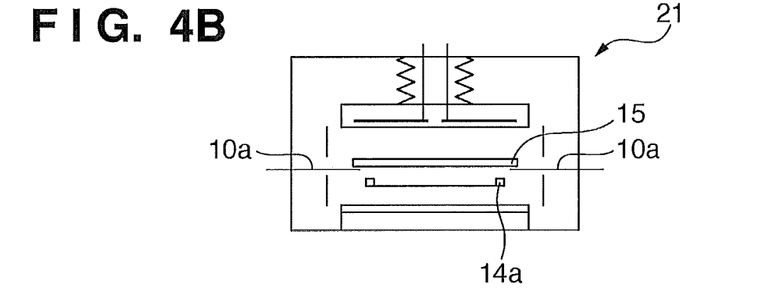
FIG. 4B is a view for explaining the method of loading the substrate 15.

The end effector 14a is moved downward to place the substrate 15 on the substrate support members 10a, as shown in FIG. 4B.

Figure 4C:
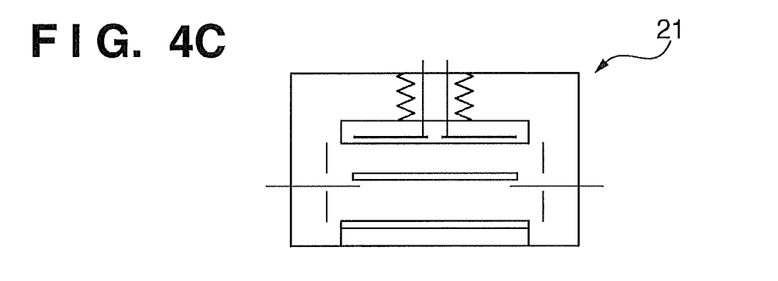
FIG. 4C is a view for explaining the method of loading the substrate 15.

After that, the end effector 14a retreats from the substrate process chamber 21, as shown in FIG. 4C.

Figure 4D:
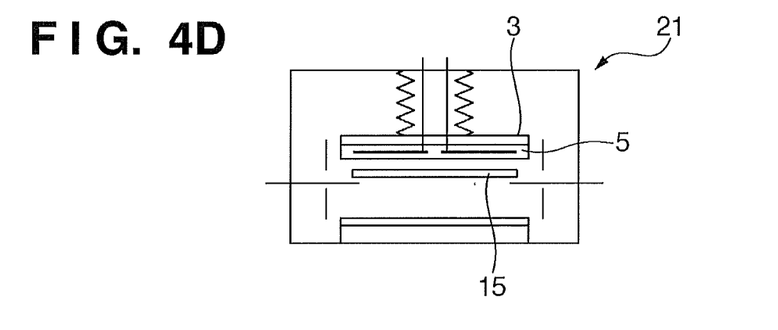
FIG. 4D is a view for explaining the method of loading the substrate 15.

The substrate holder 3 is moved vertically downward from above the substrate 15 up to a position immediately before the electrostatic chuck holder 5 of the substrate holder 3 comes into contact with the substrate 15, as shown in FIG. 4D.

Figure 4E:
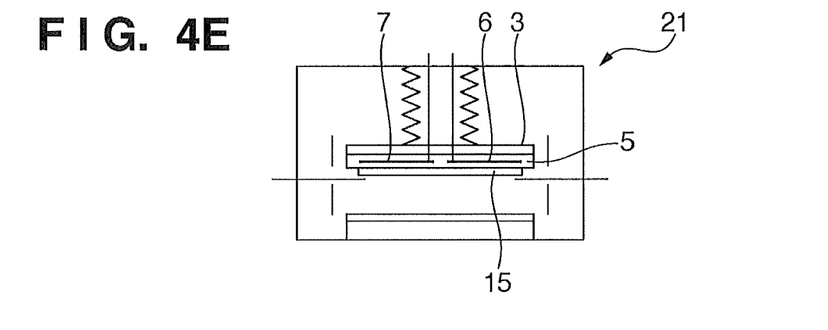
FIG. 4E is a view for explaining the method of loading the substrate 15.

The substrate holder 3 is further moved vertically downward from above the substrate 15 up to a position where the electrostatic chuck holder 5 comes into contact with the substrate 15, as shown in FIG. 4E.

Voltages are applied to the electrostatic chuck electrodes 6 and 7 so as to generate a voltage difference. The electrostatic chuck holder 5 of the substrate holder 3 thus chucks the substrate 15.

Figure 4F:
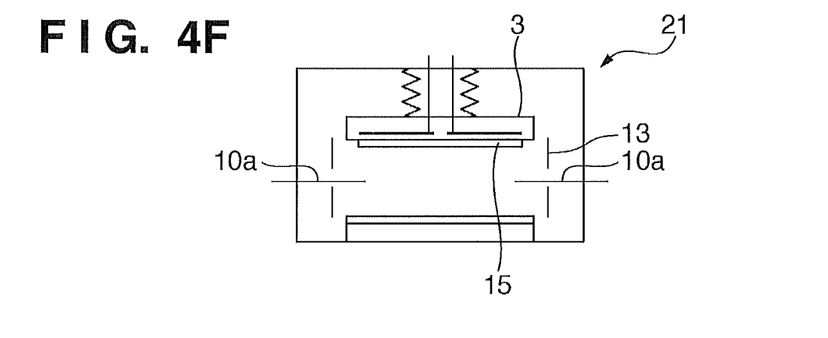
FIG. 4F is a view for explaining the method of loading the substrate 15.

The substrate holder 3 is lifted and moved to a predetermined process position, as shown in FIG. 4F.

Figure 4G:
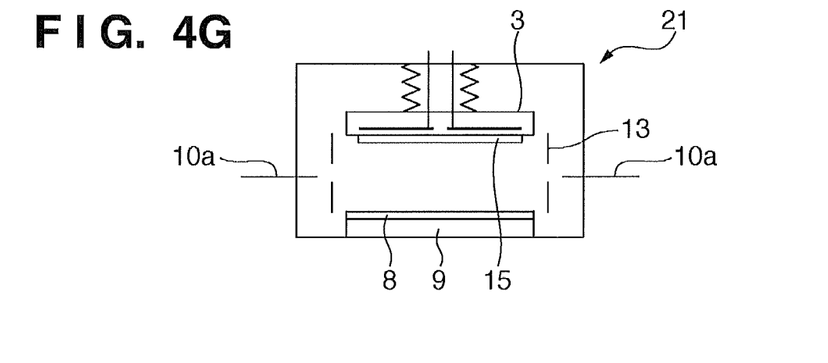
FIG. 4G is a view for explaining the method of loading the substrate 15.

The substrate support members 10a inside the substrate process chamber 21 move out of the shield 13. At this time, the driving units 10b included in the moving mechanisms cause the substrate support members 10a shown in FIG. 2 to retreat to positions (the retreat positions of the substrate support members 10a) where the sputtering substance from the target 8 does not stick, as shown in FIG. 4G.

Next, the magnet unit 9 forms a predetermined magnetic field distribution on the surface of the target 8, and the DC power supply 11 applies a negative DC voltage to the target 8. This causes discharge at a low pressure so that the target 8 takes positive ions in the discharge plasma through its surface and liberates sputtering particles. The sputtering particles stick to the substrate 15 so that a sputtering deposition process is performed. The sputtering particles, which scatter not only toward the substrate 15 but also in all directions, are blocked by the shield 13 so they rarely scatter out of it. Hence, the sputtering particles are rarely deposited inside the substrate process chamber 21.

Note that during the deposition process after the start of discharge, the discharge pressure may be adjusted as needed while supplying a gas from a gas supply system (not shown).

After the end of deposition process, the substrate 15 is unloaded in an order opposite to that of loading.

More specifically, the substrate support members 10a that have moved out of the shield 13 move into the shield 13, and stop at a position vertically under the substrate 15 chucked by the electrostatic chuck holder 5 of the substrate holder 3 (FIG. 4F).

After that, the substrate holder 3 vertically moves downward up to a position where the substrate 15 chucked by the electrostatic chuck holder 5 comes into contact with the substrate support members 10a (FIG. 4E).

Then, voltage application to the electrostatic chuck electrodes 6 and 7 stops. After the substrate 15 has moved onto the substrate support members 10a under its own weight (FIG. 4D), the substrate holder 3 vertically moves upward (FIG. 4C).

Finally, the end effector 14a moves the substrate 15 out of the substrate process chamber 21 (FIGS. 4B and 4A).

Figure 5:
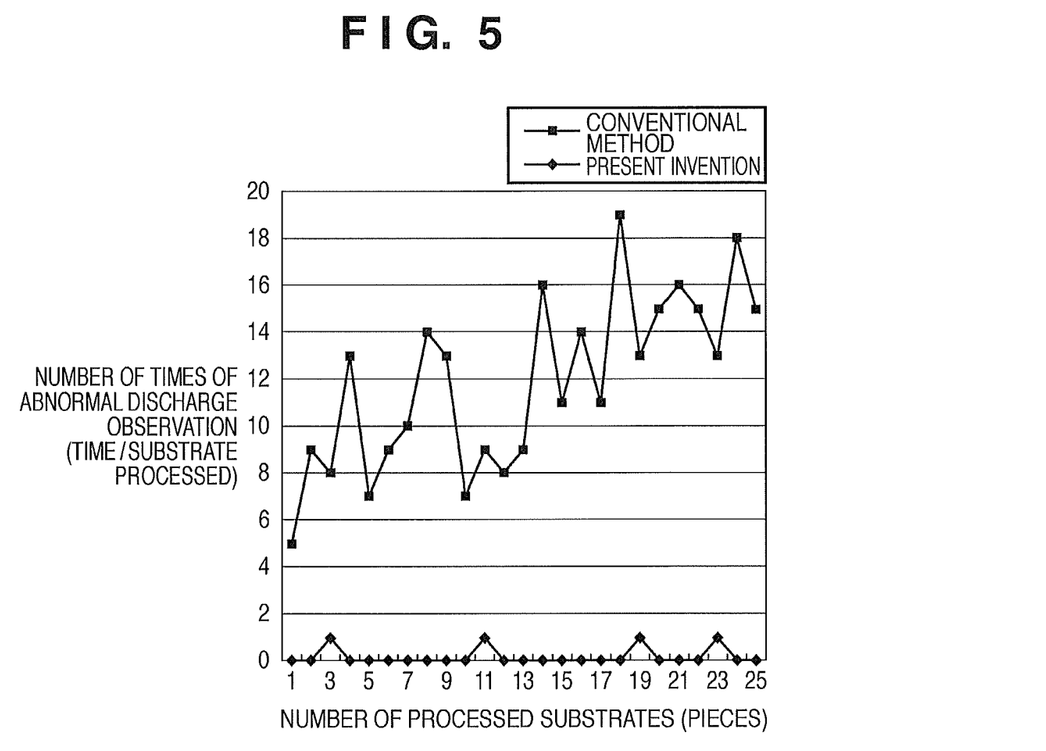
FIG. 5 is a graph showing the effect obtained by using the vacuum processing apparatus according to the first embodiment and that obtained by using a conventional apparatus.

FIG. 5 is a graph showing the effect obtained by using the vacuum processing apparatus 1 according to the first embodiment of the present invention and that obtained by using a conventional apparatus. The abscissa of the graph in FIG. 5 represents the number of continuously processed substrates, and the ordinate represents the number of times of abnormal discharge per substrate observed during the substrate process. Note that the number of times of abnormal discharge is already known to be proportional to the number of foreign substances (particles) that drop from above the target and stick to the target. The abnormal discharge was determined by monitoring the voltage and current of the DC power supply for discharge.

As can be confirmed from the graph of FIG. 5, according to the vacuum processing apparatus 1 of the present invention, the frequency of abnormal discharge caused by the foreign substances (particles) that drop and stick to the target 8 greatly decreases.

Second Embodiment

If the substrate process temperature in the sputtering process needs to be high, a substrate holder 3 may include a temperature adjustment mechanism. The temperature adjustment mechanism adjusts the temperature of a substrate chuck surface 5a shown in FIG. 2. The temperature adjustment mechanism is, for example, a heater incorporated in the substrate holder 3 or a mechanism for circulating a liquid heat transport medium to the substrate holder 3. Note that the heater and the heat transport medium circulating mechanism may be used together to increase the temperature controllability of the substrate holder 3.

When the substrate process temperature needs to be high, it is preferable to cause the temperature adjustment mechanism to heat the substrate holder 3, and thus heat a process target substrate 15 by the radiant heat from the substrate holder 3.

The substrate 15 transported from the outside of a substrate process chamber 21 is cooler than the substrate holder 3.

If the substrate 15 cooler than the substrate holder 3 heated in advance is set on the substrate holder 3 and electrostatically chucked, the substrate 15 expands as its temperature rises. Since the suction force acts between the substrate holder 3 and the substrate 15 at this time, the surface of the substrate holder 3 may rub against the surface of the substrate 15, and foreign substances (particles) may be generated from one or both of the surface of the substrate holder 3 and that of the substrate 15.

For this reason, if the substrate process temperature needs to be raised, it is preferable to maintain the positional relationship between the substrate holder 3 and the substrate 15 moved to near the substrate holder 3 and heat the substrate 15 in advance up to the same temperature as that of the substrate holder 3 by the radiant heat from the substrate holder 3.

Figure 6:
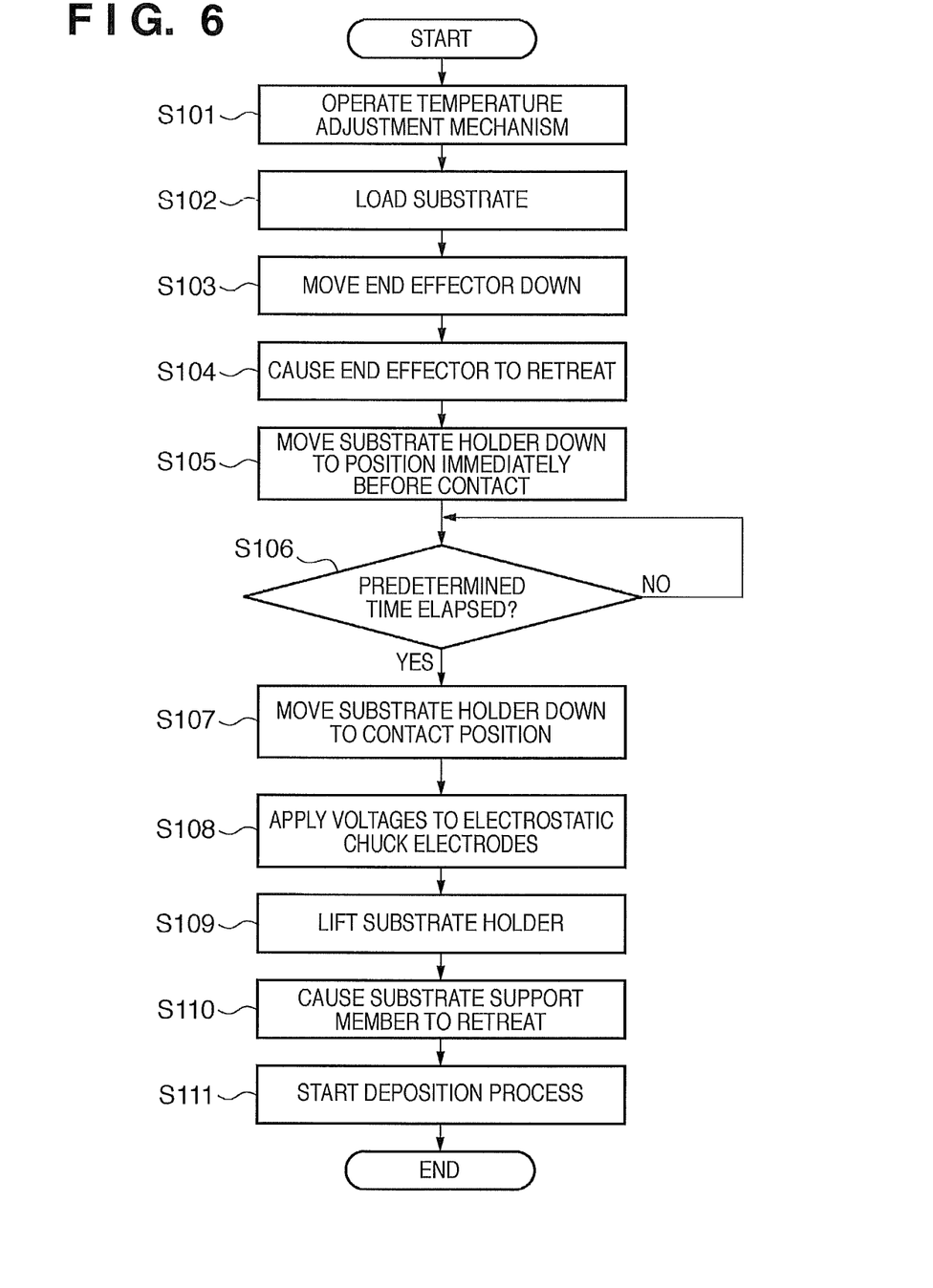
FIG. 6 is a flowchart illustrating the operation of the controller of a vacuum processing apparatus according to the second embodiment.

Transport of the substrate 15 according to this embodiment will be described with reference to the accompanying drawings. FIG. 6 is a flowchart illustrating control of a controller according to the second embodiment. The positional relationship of the substrate holder 3 and substrate support mechanisms 10 is the same as that shown in FIGS. 4A to 4G.

First, in step S101, the controller operates the temperature adjustment mechanism of the substrate holder 3 to adjust the chuck surface for the substrate 15 to a desired temperature. In step S102, the substrate 15 is placed on an end effector 14a of a transport robot 14 and moved to a position vertically under the substrate holder 3 (FIG. 4A).

In step S103, the end effector 14a is moved downward to place the substrate 15 on substrate support members 10a (FIG. 4B).

After that, in step S104, the end effector 14a retreats from a substrate process chamber 21 (FIG. 4C).

In step S105, the substrate holder 3 is moved vertically downward from above the substrate 15 up to a position immediately before an electrostatic chuck holder 5 of the substrate holder 3 comes into contact with the substrate 15, as shown in FIG. 4D.

In this state, the process waits until a predetermined time has elapsed (step S106). During this time, the substrate 15 is heated using the radiant heat from the surface of the electrostatic chuck holder 5. The substrate 15 expands as its temperature rises in heating. However, when the rise of the substrate temperature is saturated, the expansion of the substrate 15 converges. The predetermined time in step S106 is set as follows. For example, the temperature adjustment mechanism of the substrate holder 3 heats the chuck surface 5a to a predetermined temperature, the substrate holder 3 is moved close to the substrate 15, and the time until the substrate temperature is saturated is obtained in advance. This time is set as the predetermined time.

After the elapse of the predetermined time (YES in step S106), in step S107, the substrate holder 3 is further moved vertically downward from above the substrate 15 up to a position where the substrate holder 3 comes into contact with the substrate 15 whose thermal expansion has converged, as shown in FIG. 4E. In step S108, voltages are applied to electrostatic chuck electrodes 6 and 7 so as to generate a voltage difference. The electrostatic chuck holder 5 of the substrate holder 3 thus chucks the substrate 15. Note that instead of determining the elapse of the predetermined time, a temperature sensor such as a thermistor may be provided inside the substrate holder 3 or in the interface between the electrostatic chuck holder 5 and the substrate holder 3. Data detected by the temperature sensor may be input to the controller to determine, based on the data, the timing to bring the substrate holder 3 into contact with the substrate 15. As for the criterion to determine the timing, for example, whether the temperature changes of the electrostatic chuck holder 5 and the substrate 15 are saturated, or whether the substrate 15 has reached a predetermined saturation temperature can be determined. Alternatively, it may be determined whether the substrate 15 has reached a predetermined temperature. A plurality of temperature sensors may be provided to determine whether the temperature difference at each portion is saturated.

The subsequent steps are the same as in the above-described first embodiment. More specifically, in step S109, the substrate holder 3 is lifted and moved to a predetermined process position, as shown in FIG. 4F. Then, in step S110, the substrate support members 10a move outside of a shield 13, and to the outside of the substrate process chamber 21. The substrate support members 10a retreat to positions where the sputtering substance from a target 8 does not stick, as shown in FIG. 4G, and the deposition process starts.

Even when the substrate is heated to a high temperature, substrate transport according to the above-described procedure makes it possible to perform high-quality deposition in the vacuum processing apparatus further including the temperature adjustment mechanism.

The substrate 15 is heated while maintaining the state in which the substrate 15 is located near the substrate holder 3. At this time, if the substrate that remains on the end effector 14a is directly heated without using the substrate support members 10a, the end effector 14a is also heated. If the end effector 14a is heated, the heat is transported to the robot so as to heat the driving system of the robot. This may make the robot halt or malfunction. Using the vacuum processing apparatus 1 according to the embodiment of the present invention allows to shorten the time the transport robot 14a is located under the substrate holder 3 and also prevent the end effector 14a from being heated. It is therefore possible to suppress the above-described malfunction and the like of the robot.

If the substrate 15 kept placed on the end effector 14a is heated, the substrate 15 cannot be transported during that time. This lowers throughput in the vacuum processing apparatus having a plurality of chambers. Performing the vacuum process using the substrate support members 10a, as in the vacuum processing apparatus 1 of the present invention, solves the problem of throughput.

In the above-described first and second embodiments, a sputtering apparatus having a target has been explained. However, the application of the present invention is not limited to this. More specifically, the present invention is suitably applicable to any apparatus other than the sputtering apparatus, such as a PVD (Physical Vapor Deposition) apparatus, CVD apparatus, ALD apparatus, or dry etching apparatus, if it processes the substrate 15 fixed to the substrate holder by electrostatic chuck while making its process surface vertically face down.

The present invention is applicable to, for example, the manufacture of the following electronic devices. Sputtering deposition using a ceramic target readily produces powder deposits on members other than the substrate. The powder deposits have weak adhesion and therefore easily change to particles. Examples are ITO (Indium Tin Oxide) used in an LCD and PZT (Lead Zirconate Titanate) used in a piezoelectric element or a ferroelectric memory. When forming such a film, the face-down type apparatus is effective to suppress particle mixing into the film on the substrate. When forming a GaN film for an LED or a power device by MBE or sputtering using a Ga metal as a source, the face-down type apparatus needs to be used because the melting point of the Ga metal is as low as 29.8° C. The fundamental of the present invention is a face-down type vacuum processing apparatus capable of suppressing article mixing onto a substrate. Hence, the present invention is suitable adaptive to any processing apparatus and electronic device manufacture which suffer a similar problem of particle mixing onto a substrate.

The substrate support mechanisms 10 need not always horizontally move the substrate support members 10a. For example, the substrate support mechanisms 10 may move the substrate support members 10a upward at the time of chucking and make them retreat downward during the vacuum process. Alternatively, the substrate support mechanisms 10 may move the substrate support members 10a horizontally and vertically. The substrate support mechanisms preferably move the substrate support members 10a only in a direction parallel to the substrate chuck surface 5a of the electrostatic chuck holder 5, as in this embodiment. The substrate support mechanisms 10 can have a simple structure, and be installed without impeding the process of the substrate 15. It is therefore possible to suppress an increase in particles caused by a complex structure or an increase in particles caused by a larger opening diameter of the shield 13.

Making the substrate support members 10a retreat from the position vertically under the substrate holder 3 is not essential in the present invention. However, it is preferable because retreating at the time of the substrate process allows to prevent process substances from sticking and suppress contamination and an increase in particles.

In the above embodiments, the shield 13 has such a shape that surrounds the substrate process space However, it may have a shape that surrounds the substrate support members 10a that have retreated.

If at least the substrate supporting portion of each substrate support member 10a is arranged in the vacuum process chamber, the proximal end of the substrate support member 10a may extend out of the vacuum chamber 2.

In the above-described first and second embodiments, the substrate chuck surface 5a vertically facing down has been explained. However, the gist of the present invention is not limited to this example. For example, the substrate chuck surface 5a may tilt as far as the substrate support members 10a supports the substrate 15 horizontally with respect to the substrate chuck surface 5a.

Third Embodiment

Figure 7:
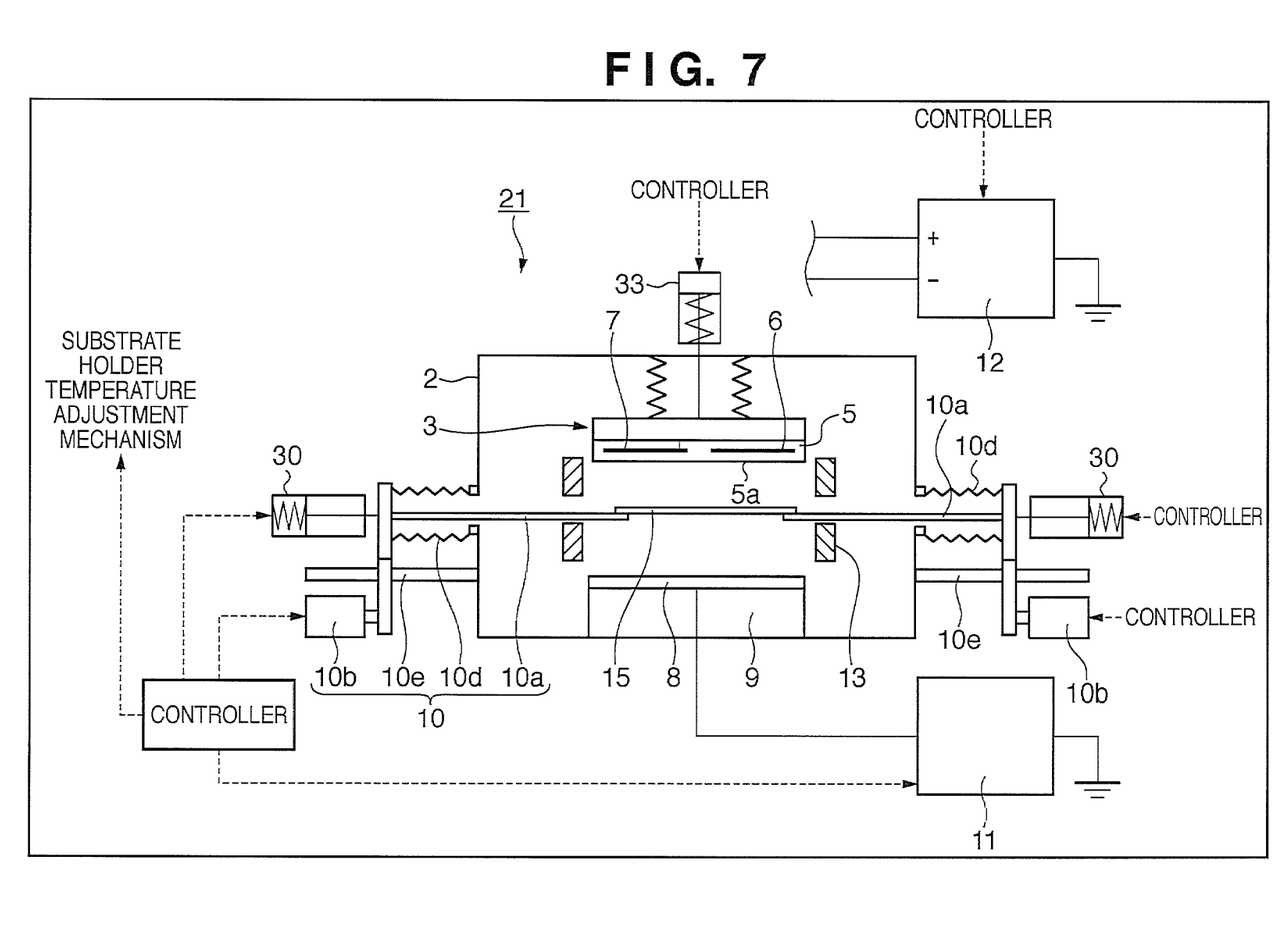
FIG. 7 is a view illustrating the arrangement of a vacuum processing apparatus according to the third embodiment.

The third embodiment will be described next with reference to the schematic view of FIG. 7. Note that the same reference numerals as in the first embodiment denote the common apparatus components in the third embodiment, and a description thereof will not be repeated.

A vacuum processing apparatus 1 according to the third embodiment is different from that of the first embodiment in that substrate support members 10a are arranged under a substrate holder 3 when the substrate holding force (the force to hold a substrate) falls below the force (substrate load) necessary for holding a substrate (for example, in case of a power failure) during the process. More specifically, the apparatus includes biasing members 30 which continuously bias, toward the transport positions under the substrate holder 3, the substrate support members 10a that are located at the retreat positions. When the operation of driving units 10b has stopped due to a power failure or the like, the biasing force of the biasing members 30 moves the substrate support members 10a to the transport positions. Each biasing member 30 is designed as a cylinder which moves the corresponding substrate support member 10a in the translating direction (from the retreat position to the transport position or from the transport position to the retreat position) by, for example, the elastic force of an elastic body (e.g., spring or fluid).

On the other hand, the driving units 10b of the substrate support members 10a can directly use the biasing force to drive the substrate support members 10a to the transport positions. The driving units 10b can also generate an additional driving force to drive the substrate support members 10a and move the substrate support members 10a to the transport positions. The substrate support members 10a are driven to the retreat positions by generating driving forces equal to or more than the biasing forces in directions opposite to those of the biasing forces. For example, when each driving unit 10b is formed from an air cylinder or a hydraulic cylinder, it may be either a single acting cylinder for generating only a driving force toward the retreat position or a double acting cylinder capable of generating driving forces toward both the retreat position and the transport position.

Note that in the third embodiment, the biasing member 30 and the driving unit 10b are formed as separate members. However, the biasing member 30 and the driving unit 10b may be integrated. For example, they may be formed as a single acting cylinder whose home position (normal position) is the transport position.

Additionally, in the third embodiment, a moving mechanism 33 of the substrate holder 3 includes a single acting cylinder whose normal position is the transport position so as to move the substrate holder 3 vertically based on an instruction from a controller.

Figure 8:
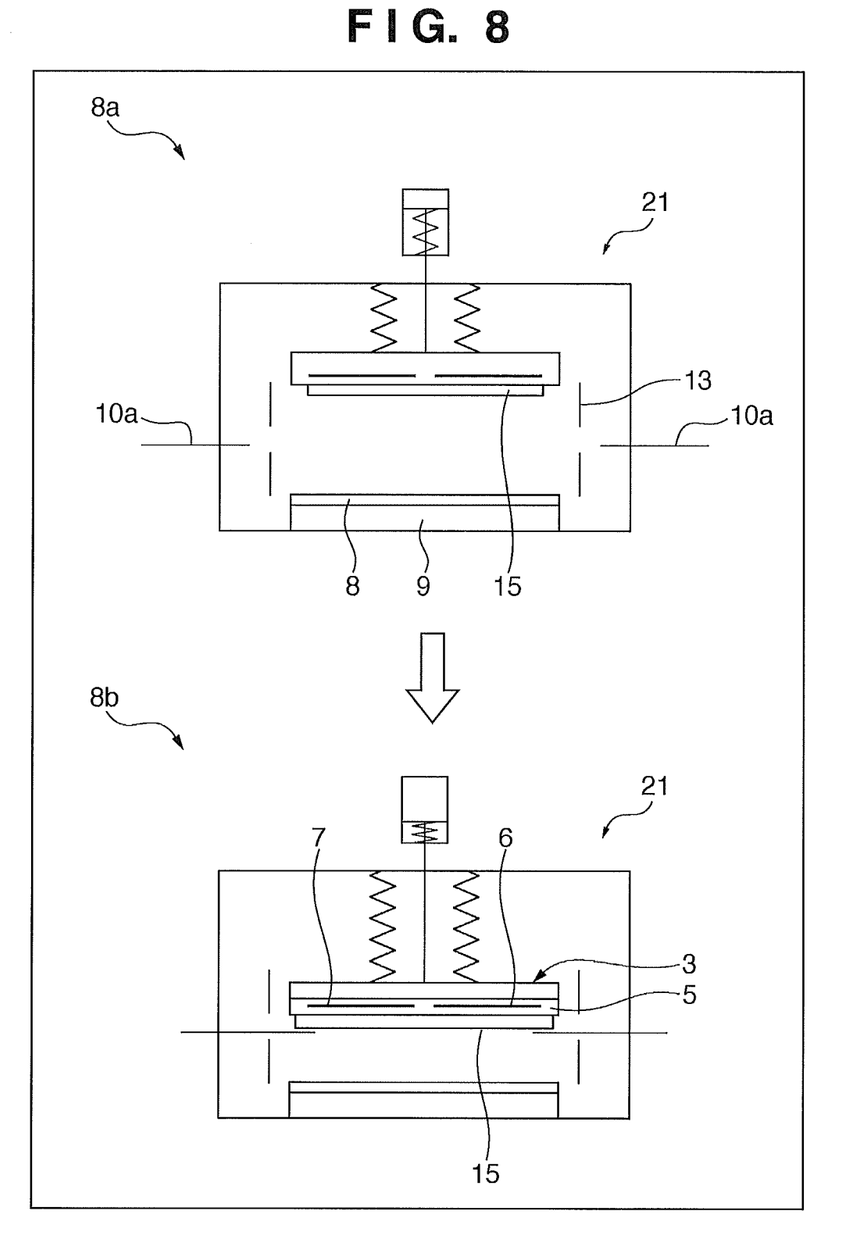
FIG. 8 is a view showing the drop prevention operation of the vacuum processing apparatus according to the third embodiment.

The operation of the vacuum processing apparatus 1 having the above-described arrangement will be described with reference to FIG. 8. Reference numeral 8a in FIG. 8 indicates a state of the vacuum processing apparatus 1 during the process. Assume that power supply to electrostatic chuck electrodes 6 and 7 stop due to, for example, a power failure in this state. The substrate holder 3 holds a substrate 15 for a while by residual charges. Then, the holding force is lost, and the substrate 15 drops under its own weight.

At this time, driving force supply from the driving source also stops, and the substrate support members 10a are driven to the transport positions by the biasing forces of the biasing members 30. Similarly, driving force supply to the moving mechanism 33 of the substrate holder 3 also stops, and the substrate holder 3 moves downward to the transport position by its load.

In this case, even when the substrate 15 drops, the substrate support members 10a can receive it, as indicated by 8b in FIG. 6, thereby preventing damage to the substrate 15 and the target. In the third embodiment, since the substrate holder 3 moves down simultaneously, the drop distance can be shorter. It is therefore possible to reliably prevent drop of the substrate.

As described above, when the substrate holding force falls below the force (substrate load) necessary for holding a substrate during the process, the substrate support members 10a move into a substrate process chamber 21 so as to function as a mechanism for preventing substrate drop. This allows to solve the problem of substrate drop unique to the face-down type apparatus. In case of substrate drop, it is necessary to exchange the target that has received the dropped substrate and remove the substrate fragments by stopping the line and exposing the interior of the substrate process chamber 21 to the atmosphere. The cost for line stop and recovery is enormous. Providing another substrate drop prevention mechanism is also considerable. However, it is difficult to provide a structure for drop prevention in the deposition space without influencing the deposition process. In addition, the structure can be a contamination source. From this viewpoint, forming a substrate drop prevention mechanism by the substrate support members 10a, as in the present invention, allows to effectively prevent substrate drop without posing a problem of contamination or the like.

Fourth Embodiment

Figure 9:
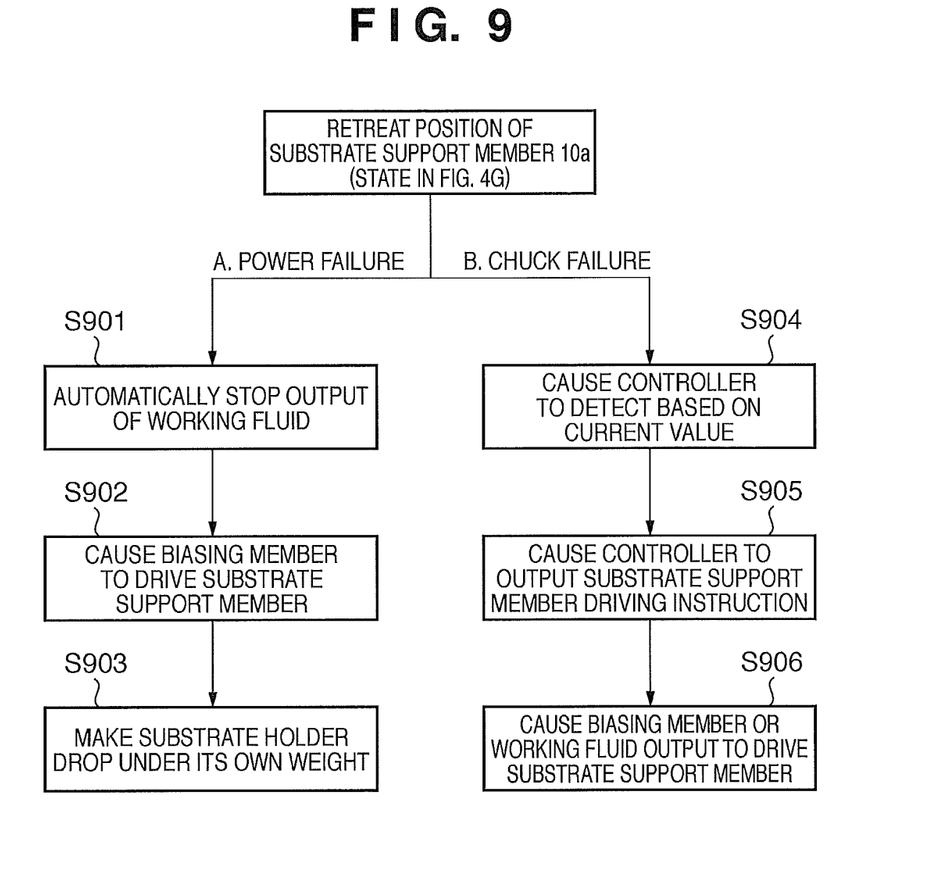
FIG. 9 is a flowchart for explaining the drop prevention operation of a vacuum processing apparatus according to the fourth embodiment.

A drop prevention sensor for detecting a substrate chuck failure may be added to the vacuum processing apparatus of the third embodiment so as to detect that the substrate holding force is lower than the substrate load. The drop prevention operation of a vacuum processing apparatus including the drop prevention sensor according to the fourth embodiment will be described with reference to FIG. 9. As shown in FIG. 9, in case of a power failure (A in FIG. 9), the controller of the vacuum processing apparatus executes the following processing to cause biasing members 30 of the third embodiment to arrange substrate support members 10a at drop prevention positions (transport positions). First, when a power failure has occurred, the output of the working fluid automatically stops (S901). The biasing members 30 drive the substrate support members 10a to move them under a substrate holder 3 (S902). The substrate holder 3 moves down under its own weight, and the substrate support members 10a receive a substrate 15 (S903).

If the electrostatic chuck force falls below the substrate holding force without a power failure (B in FIG. 9), the biasing members 30 or driving units 10b actively arrange the substrate support member 10a at the drop prevention positions. The controller of the vacuum processing apparatus executes the following processing. First, the controller detects a chuck failure based on the current value (S904). The controller drives the substrate support members (S905), and arranges them under the substrate holder 3 to receive the substrate 15 (S906). This enables to reliably prevent drop of the substrate 15.

For example, when flowing a gas for heat transmission to the reverse surface side of the substrate 15 chucked by an electrostatic chuck holder 5, a pressure sensor for measuring the pressure in the space on the reverse surface side of the substrate 15 may be provided as the drop prevention sensor to detect that the pressure is less than or equal to a predetermined value. That is, if the substrate 15 is not chucked by the electrostatic chuck holder 5, the gas leaks from the space on the reverse surface side so the predetermined pressure cannot be maintained. Hence, the pressure sensor can detect the chuck failure of the substrate 15 by detecting that the pressure is lower than the predetermined pressure. When the controller of the fourth embodiment has determined based on the output of the pressure sensor that the pressure is lower than the predetermined threshold (predetermined pressure), the pressure sensor determines that the substrate 15 is not normally chucked by the electrostatic chuck holder 5 so that an instruction to arrange the substrate support members 10a at the drop prevention positions is output to the driving units, 10b. The controller receives the instruction and executes the processing in steps S904 to S906, thereby preventing drop of the substrate 15 due to a chuck failure or the like during the process.

The preferred embodiments of the present invention have been described above with reference to the accompanying drawings. However, the present invention is not limited to the above embodiments, and various changes and modifications can be made within the technical scope determined by the scope of claims.

This application claims the benefit of Japanese Patent Application No. 2008-161477, filed on Jun. 20, 2008, which is hereby incorporated by reference herein in its entirety.

The invention claimed is:

1. A sputtering method of performing a sputtering process using a substrate holder while keeping the substrate holder electrostatically chucking a substrate, the substrate holder being provided in an evacuatable vacuum chamber, having a substrate chuck surface that is directed to a vertical downward direction, and including an electrostatic chuck mechanism which electrostatically chucks the substrate, comprising the steps of:
- a first step of causing a substrate transport mechanism to move a substrate table from a conveyance chamber into the vacuum chamber and to transport the substrate located on the substrate table to a space beneath the substrate holder, through an opening of a shield which is provided in the vacuum chamber and for separating a process space of the substrate from a space on a side of an inner wall of the vacuum chamber;
- a second step of transferring the substrate located on the substrate table from the substrate table to substrate support members, beneath the substrate holder, in an orientation that allows the substrate chuck surface to chuck the substrate;
- a third step of bringing the substrate chuck surface in the vertical downward direction into contact with the substrate while keeping the substrate support members supporting the substrate in a stationary manner;
- a fourth step of operating the electrostatic chuck mechanism to electrostatically chuck the substrate while keeping the substrate and the substrate chuck surface in contact with each other;
- a fifth step of, after the substrate has been chucked, making the substrate support members retreat from a position where the substrate has been chucked to the space on the side of the inner wall through the opening of the shield;
- a sixth step of performing the sputtering process.

2. The sputtering method according claim 1, wherein the substrate support members comprise a plurality of substrate support members which positioned symmetrically around a center of the substrate center.

3. The sputtering method according claim 1, wherein the substrate is transferred to the substrate support members in a state where said substrate is in parallel to the substrate chuck surface of the substrate holder.

4. The sputtering method according claim 1, wherein the substrate support members are comprised of a first substrate support member and a second substrate support member which are provided on both sides of a discharge space.

5. The sputtering method according claim 1,
wherein the substrate support members are comprised of three or more substrate support members which are provided respectively at different positions in a discharge space.

6. The sputtering method according claim 1, further comprising a seventh step of retreating the substrate table from the vacuum chamber, between said third step and said fourth step.

7. The sputtering method according claim 1, further comprising:
- an eighth step of, after said fifth step, moving the substrate support members, which have been retreated outside of the shield, to a space of the inner side of the shield; and
- a ninth step of stopping a voltage applying to the electrostatic chuck mechanism and transferring the substrate from the substrate holder to the substrate support members.

8. The sputtering method according claim 1, wherein in said second step, the transferring of the substrate from the substrate table to the substrate support members are performed by lowering the substrate table and locating the substrate on the substrate support members.

9. The sputtering method according claim 1, further comprising between said second step and said third step:
- a step of lowering the substrate holder from above the substrate toward a vertical downward direction and of moving the substrate holder to an immediately preceding position where the electrostatic chuck mechanism of the substrate holder is brought into contact with the substrate;
- a step of heating the substrate using radiation heat from the surface of the electrostatic chuck mechanism or using a temperature regulating mechanism of the substrate holder; and
- a step of further lowering the substrate holder toward a vertical downward direction and of moving the substrate holder to a position where the electrostatic chuck mechanism of the substrate holder is brought into contact with the substrate.

10. An electronic device manufacturing method using a sputtering apparatus for performing a vacuum process while keeping a substrate holder electrostatically chucking a substrate, the substrate holder being provided in an evacuatable vacuum chamber, having a substrate chuck surface vertically facing down, and including an electrostatic chuck mechanism which electrostatically chucks the substrate, comprising the steps of:
- a first step of causing a substrate transport mechanism to move a substrate table from a conveyance chamber into the vacuum chamber and to transport the substrate located on the substrate table to a space beneath the substrate holder, through an opening of a shield which is provided in the vacuum chamber and for separating a process space of the substrate from a space on a side of an inner wall of the vacuum chamber;
- a second step of transferring the substrate located on the substrate table from the substrate table to substrate support members, beneath the substrate holder, in an orientation that allows the substrate chuck surface to chuck the substrate;
- a third step of bringing the substrate chuck surface in a vertical direction into contact with the substrate while keeping the substrate support members in a stationary manner;
- a fourth step of operating the electrostatic chuck mechanism to electrostatically chuck the substrate while keeping the substrate and the substrate chuck surface in contact with each other;
- a fifth step of, after the substrate has been chucked, making the substrate support members retreat from a position where the substrate has been chucked to the space on the side of the inner wall through the opening of the shield; and
- a sixth step of, performing the vacuum process for the electrostatically chucked substrate.

11. The sputtering method according claim 10, wherein the substrate support members are positioned symmetrically around a center of the substrate center.

12. The sputtering method according claim 10, wherein the substrate is transferred to the substrate support members in a state where said substrate is in parallel to the substrate chuck surface of the substrate holder.

13. The sputtering method according claim 10, wherein the substrate support members are comprised of a first substrate support member and a second substrate support member which are provided on both sides of a discharge space.

14. The sputtering method according claim 10, wherein substrate support members are comprised of three or more substrate support members which are provided respectively at different positions in a discharge space.

15. The sputtering method according claim 10, further comprising a seventh step of retreating the substrate table from the vacuum chamber, between said third step and said fourth step.

16. The sputtering method according claim 10, further comprising:
    an eighth step of, after said sixth step, moving the substrate support members, which have been retreated outside of the shield, to a space of the inner side of the shield; and
    a ninth step of stopping a voltage applying to the electrostatic chuck mechanism and transferring the substrate from the substrate holder to the substrate support members.

17. The sputtering method according claim 10,
    wherein in said second step, the transferring of the substrate from the substrate table to the substrate support members are performed by lowering the substrate table and locating the substrate on the substrate support members.

18. The sputtering method according claim 10,
    further comprising between said second step and said third step:
    a step of lowering the substrate holder from above the substrate toward a vertical downward direction and of moving the substrate holder to an immediately preceding position where the electrostatic chuck mechanism of the substrate holder is brought into contact with the substrate;
    a step of heating the substrate using radiation heat from the surface of the electrostatic chuck mechanism or using a temperature regulating mechanism of the substrate holder; and
    a step of further lowering the substrate holder toward a vertical downward direction and of moving the substrate holder to a position where the electrostatic chuck mechanism of the substrate holder is brought into contact with the substrate.

* * * * *